United States Patent

Takekuma et al.

[11] Patent Number: 5,580,607
[45] Date of Patent: Dec. 3, 1996

[54] COATING APPARATUS AND METHOD

[75] Inventors: Takashi Takekuma, Yamaga; Masaaki Murakami; Masatoshi Deguchi, both of Kumamoto; Akihiro Fujimoto, Kumamoto-ken, all of Japan

[73] Assignees: Tokyo Electron Limited, Tokyo; Tokyo Electron Kyushu Limited, Tosu, both of Japan

[21] Appl. No.: 186,879

[22] Filed: Jan. 26, 1994

Related U.S. Application Data

[63] Continuation-in-part of Ser. No. 918,014, Jul. 24, 1992, abandoned.

[30] Foreign Application Priority Data

Jul. 26, 1991 [JP] Japan ..................... 3-187791
Jan. 26, 1993 [JP] Japan ..................... 5-029714

[51] Int. Cl.$^6$ ........................................ B05D 3/12
[52] U.S. Cl. .................. 427/240; 427/384; 427/385.5; 118/52; 118/59
[58] Field of Search ................ 427/240, 385.5, 427/384; 118/52, 59

[56] References Cited

U.S. PATENT DOCUMENTS 4,851,263  7/1989  Ishii et al. ..................... 427/240

FOREIGN PATENT DOCUMENTS 60165903  2/1987  Japan.
62-26817   2/1987  Japan.
63-140549  6/1988  Japan.

*Primary Examiner*—Janyce Bell
*Attorney, Agent, or Firm*—Oblon, Spivak, McClelland, Maier & Neustadt, P.C.

[57] ABSTRACT

A coating apparatus comprises a chuck on which a semiconductor wafer is adhered, a resist liquid supplying system for supplying a resist liquid to the semiconductor wafer, a motor for rotating the semiconductor wafer, thereby spreading the resist liquid over the semiconductor wafer, and a plate, on which the semiconductor wafer is placed, for creating a temperature distribution on the semiconductor wafer.

4 Claims, 8 Drawing Sheets

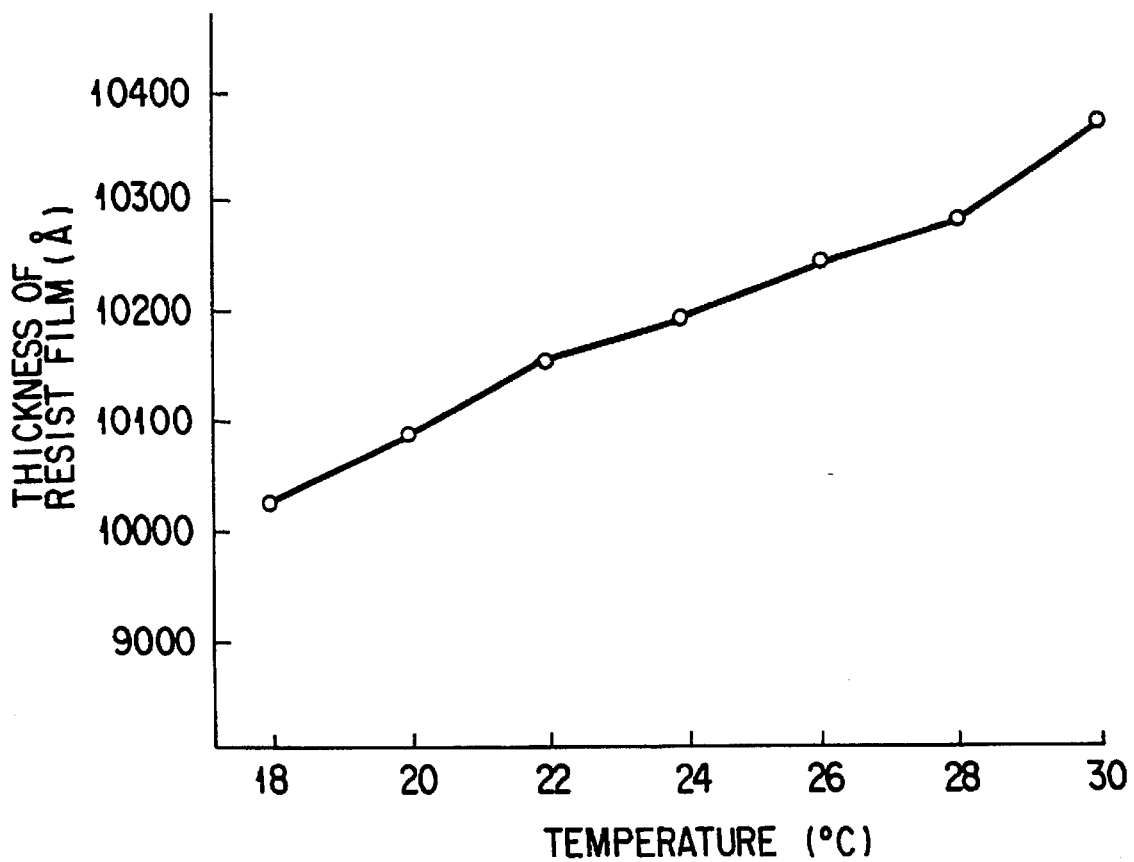
F I G. 1

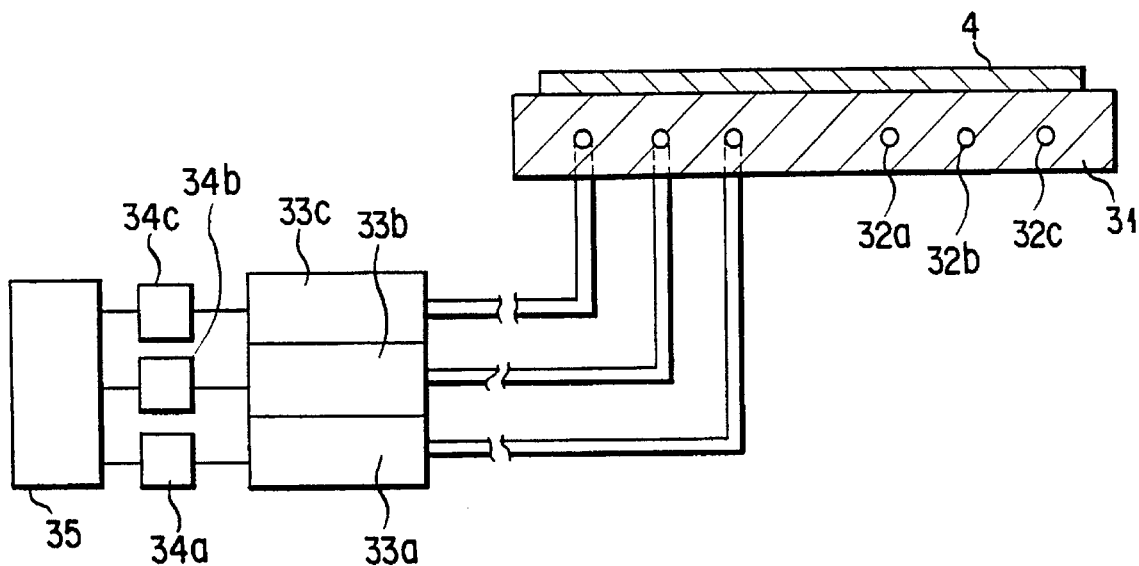
F I G. 3
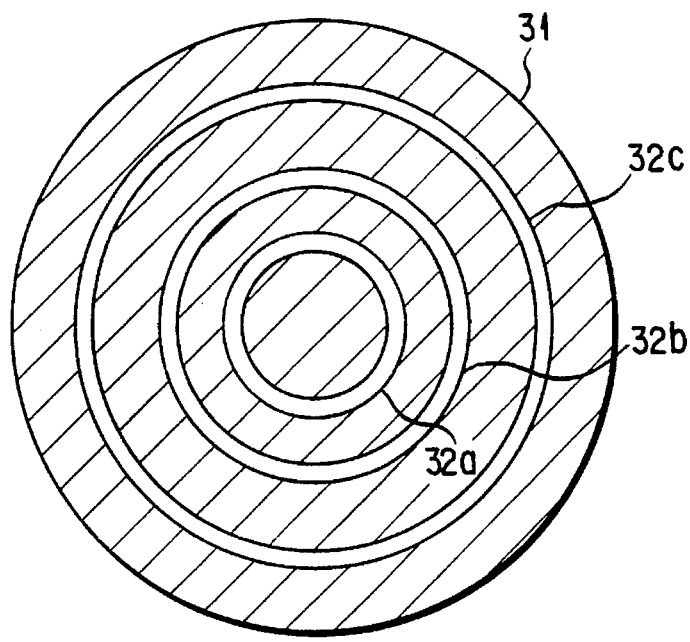
F I G. 4

COATING APPARATUS AND METHOD

This application is a Continuation-In-Part of application Ser. No. 07/918,014, filed on Jul. 24, 1992, now abandoned.

BACKGROUND OF THE INVENTION

1. Field of the Invention

The present invention relates to a coating apparatus and method for coating an object such as a semiconductor wafer with a coating liquid, such as, a resist, a developer or the like.

2. Description of the Related Art

In a pattern forming process, an electronic circuit pattern film is formed on a semiconductor wafer in the following manner. First, a resist film is coated on an undercoated thin film formed on the semiconductor wafer. Thereafter, the resist film is exposed through a mask having a predetermined pattern and developed, thereby forming a negative or positive resist pattern. Using the resist pattern as a mask, a desired electronic circuit pattern is formed on the undercoated thin film on the semiconductor wafer. Finally, the resist pattern used as a mask is removed.

If the thickness of the resist film coated on a semiconductor wafer is not uniform, the resist pattern cannot be formed accurately. Hence, it is necessary to form a resist film of uniform thickness. In particular, since the density of resist patterns has been increased in recent times, they are required to be more and more uniform in thickness.

In a resist coating step, a semiconductor wafer is generally subjected to an adhesion (AD) process at a temperature of about 90° C., in order to increase the adhesion between itself and a resist layer. The processed wafer is cooled and then coated with a resist by means of a spin coater: i.e., a resist liquid is deposited on a central portion of the semiconductor wafer, which is then rotated at a high speed. As a result, the resist liquid spreads out toward the periphery of the wafer, and coats the overall surface thereof.

When a resist is coated on a semiconductor wafer by a spin coater, the thickness of the resist film varies in the central and peripheral portions of the semiconductor wafer, since the resist solvent is volatilized into the atmosphere at different rates in the central and peripheral portions of the wafer, due to the difference in their peripheral speeds. Since the diameter of wafers has become larger in recent years, difference in the thickness of resist films have tended to increase.

In a developing step, a developer is applied to the resist film on a semiconductor wafer which has been exposed, and the resist is developed by keeping the developer on the semiconductor wafer for certain time. Since the semiconductor wafer is rotated when or after the developer is supplied thereto and a gas flow in the apparatus is generated the developing rate is not uniform.

SUMMARY OF THE INVENTION

The present invention has been developed in consideration of the above situation, and has as an object to provide an apparatus and method for coating an object such as a semiconductor wafer with a coating liquid of a very uniform thickness.

Another object of the present invention is to provide an apparatus and method for processing an object uniformly with a processing liquid.

According to a first aspect of the present invention, there is provided a coating apparatus comprising: supporting means for supporting an object to be coated; coating liquid supplying means for supplying a coating liquid to the object; rotating means for rotating the object to spread the coating liquid over the object; and temperature distribution creating means for creating a temperature distribution on the object.

According to a second aspect of the present invention, there is provided a coating method comprising the steps of: creating a temperature distribution on an object to be coated; supplying a coating liquid to the object on which a temperature distribution is created; and rotating the object to spread the coating liquid over the object.

According to a third aspect of the present invention, there is provided a coating device for applying treatment liquid to an object comprising: a support member having a diameter smaller than that of the object, for supporting the object; supplying means for supplying the treatment liquid on the surface of the object; rotating means for rotating the object by rotating the supporting member so as to spread the treatment liquid over the entire surface of the object; and temperature controlling means provided in a non-contact fashion on the rear surface side of the periphery portion extending from the supporting member, for controlling the temperature of the object.

According to a fourth aspect of the present invention, there is provided a coating device for applying treatment liquid to an object comprising: a supporting member for supporting the object; supplying means for supplying the treatment liquid on the surface of the object; and rotating means for rotating the object by rotating the supporting member so as to spread the treatment liquid over the entire surface of the object, wherein the supporting member has a shape with which a space portion is formed between itself and a periphery portion of the object when the object is supported.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 1 is a diagram showing the relationship between the temperature of a semiconductor wafer and the thickness of a resist film formed on the semiconductor wafer;

FIG. 3 is a diagram showing a longitudinal cross-section of a mechanism for creating a temperature distribution on an object to be coated;

FIG. 4 is a diagram showing a lateral cross-section of the mechanism for creating a temperature distribution on an object to be coated;

DETAILED DESCRIPTION OF THE PREFERRED EMBODIMENTS

The present inventor conducted extensive research to devise a method of coating an object such as a semiconductor wafer with a coating liquid, such as a resist, to a uniform thickness, and found that the difference in thickness of the coating due to differences in the peripheral speed, as described earlier can be canceled by the difference in temperature of the object to be coated. As shown in FIG. 1, the higher the temperature of a semiconductor wafer to be coated with a resist film, the greater the thickness of the resist film, since the volatility speed of the solvent of a resist liquid which is to be coated on the semiconductor wafer is increased as the temperature of the semiconductor wafer increases. On the other hand, the lower the temperature of a semiconductor wafer to be coated with a resist film, the less thick the resist film, since the volatility speed of the solvent of the resist liquid decreases as the temperature of the semiconductor wafer decreases. Therefore, if a temperature distribution is created on a semiconductor wafer to be coated such that the temperature of the portion which may have a greater thickness due to differences in peripheral speed is lower and the temperature of the portion which may have a smaller thickness is higher, a coating film of a uniform thickness can be formed on the semiconductor wafer.

The present invention was accomplished on the basis of this idea of the present inventor.

It is well known that the temperature of a semiconductor wafer greatly influences a resist film formed thereon. For example, a cooling plate and a holder apparatus for uniformly cooling a semiconductor wafer have been proposed (Published Examined Japanese Patent Application (PEJPA) No. 90-53939, Published Unexamined Japanese Utility Model Application (PUJUMA) No. 89-125358, PUJUMA No. 89-110430, Published Unexamined Japanese Patent Application (PUJPA) No. 64-28918, etc.) Further, a spinner head having cooling means has been also proposed (PUJPA No. 62-193248). However, the apparatuses disclosed in the above prior art documents aim at uniformly and rapidly cooling a semiconductor wafer. These documents do not suggest the idea of the present invention of creating a temperature distribution on an object to be coated. In other words, the present inventor first discovered the idea of creating a temperature distribution of an object to form a coating film of an uniform thickness.

Further, when a developer is applied to an object, the developing process cannot be performed at a uniform speed on the overall object, since the temperature of the peripheral portion of the object is lower than that of the central portion thereof by the influence of the air flow due to exhaustion. Therefore, developing process can be uniformly performed by creating a temperature distribution on the object.

The present invention will now be described in detail with reference to the drawings.

Figure 2:
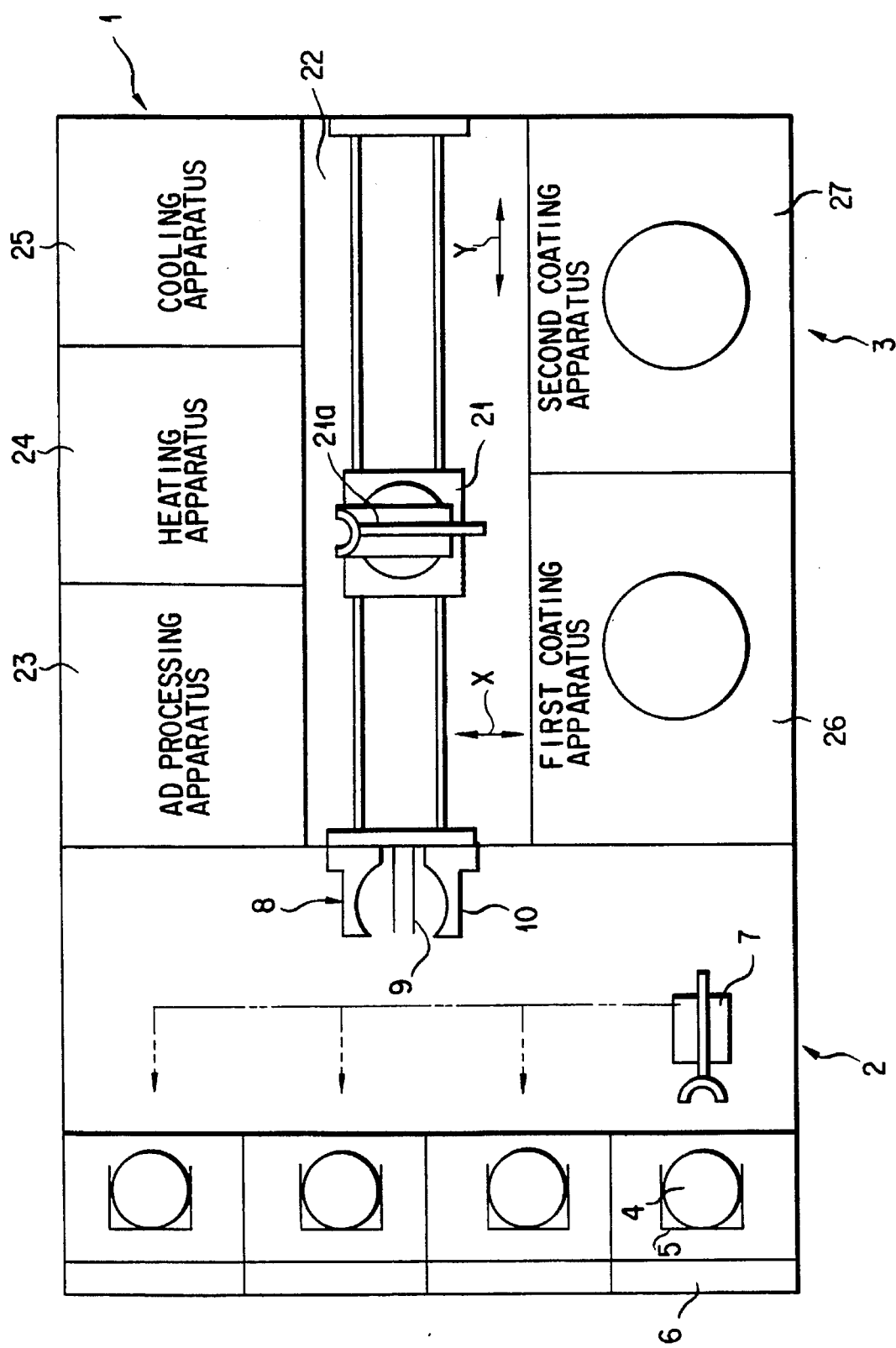
FIG. 2 is a schematic diagram showing a resist coating system in which a coating apparatus according to an embodiment of the present invention is incorporated.

FIG. 2 is a schematic diagram showing a resist coating system in which a coating apparatus according to an embodiment of the present invention is incorporated. A resist coating system 1 comprises a loader section 2 and a processing section 3. The loader section 2 includes a cassette elevator 6 which can hold and move up and down a plurality (four, in FIG. 2) of wafer cassettes 5 each holding a plurality of semiconductor wafers 4, i.e., objects to be coated. It also includes a transfer mechanism 7 for transferring wafers from/to the wafer cassettes 5, and a wafer receiving/transmitting mechanism 8 for receiving/transmitting wafers between the carriage mechanism 7 and the processing section 3. The wafer receiving/transmitting mechanism 8 comprises two stage pins 9 for holding wafers 4 and a centering guide 10 for supporting the peripheral edges of wafers 4 to align the wafers 4, and receives/transmits wafers 4 from/to a carriage apparatus 21 (to be described in detail later) in the processing section 3 by means of an elevator apparatus (not shown).

The processing section 3 processes semiconductor wafers in a predetermined manner. It includes a passageway 22 extending in a Y direction (in a horizontal direction) in FIG. 2 in its central portion. A plurality of processing apparatuses are positioned on either side of the passageway 22. The carriage apparatus 21 is movable in the passageway 22 so that wafers 4 can be carried into/out of each processing apparatus. The carriage apparatus 21 comprises an arm 21a which is movable in an X direction (a horizontal direction), the Y direction (the lateral direction), a Z direction (a vertical direction) and a θ direction (a rotational direction). Wafers 4 are carried into/out of the processing apparatuses by means of the arm 21a. The processing apparatuses are an adhesion (AD) processing apparatus 23, a heating apparatus 24 and a cooling apparatus 25, positioned on one side of the passageway 22, and a first coating apparatus 26 and a second coating apparatus 27 on the other side thereof.

The AD processing apparatus 23 heats the semiconductor wafers 4 to a temperature of, for example, 90° C. and processes them with HMDS or the like before a resist is coated on the semiconductor wafers, to increase adhesion between the semiconductor wafers 4 and the resist.

The heating apparatus 24 pre-bakes semiconductor wafers by means of a hot plate or the like to volatilize the solvent remaining in the resist coated on the semiconductor wafers.

The cooling apparatus 25 cools the semiconductor wafers 4 after the AD process or the prebaking process, and the structure thereof will be described in detail later. In this embodiment, the cooling apparatus 25 functions as means for creating a temperature distribution on semiconductor wafers 4 which are to be coated with resist in a resist coating step as will be described later. In other words, the cooling apparatus 25 creates a temperature distribution on a wafer 4 while cooling the wafer 4.

As shown in FIGS. 3 and 4, the cooling apparatus 25 has a cooling plate 31 in which a plurality (three, in FIGS. 3 and 4) of cooling tubes 32a, 32b, and 32c are embedded. The cooling tubes 32a, 32b, and 32c of the cooling plate 31 are respectively connected to coolant supplying sources 33a, 33b, and 33c, from which a coolant, for example, water is circulated. The coolant is kept in different temperatures in the coolant supplying sources 33a, 33b, and 33c by temperature controllers 34a, 34b, and 34c, thereby creating a temperature distribution on a semiconductor wafer 4 on the plate 31.

The temperature distribution is determined in accordance with various conditions, for example, the viscosity of the resist liquid in the coating apparatus (to be described later), the rotational speed of the wafer 4, the temperature of the resist. In general, a resist is coated thicker on the peripheral portion of a wafer 4 than on the central portion owing to differences in peripheral speed of the wafer 4. Accordingly, a temperature distribution is created such that the temperature is lower in the peripheral portion of the cooling plate 31. A temperature profile corresponding to the above conditions is programmed in a program setting apparatus 35 in advance. The temperatures set in the temperature controllers 34a, 34b, and 34c are determined on the basis of the program. The coolant is controlled by the temperature controllers 34a, 34b, and 34c on the basis of the values detected by the temperature sensors (not shown) each provided in the coolant supplying sources 33a, 33b, and 33c.

Figure 5:
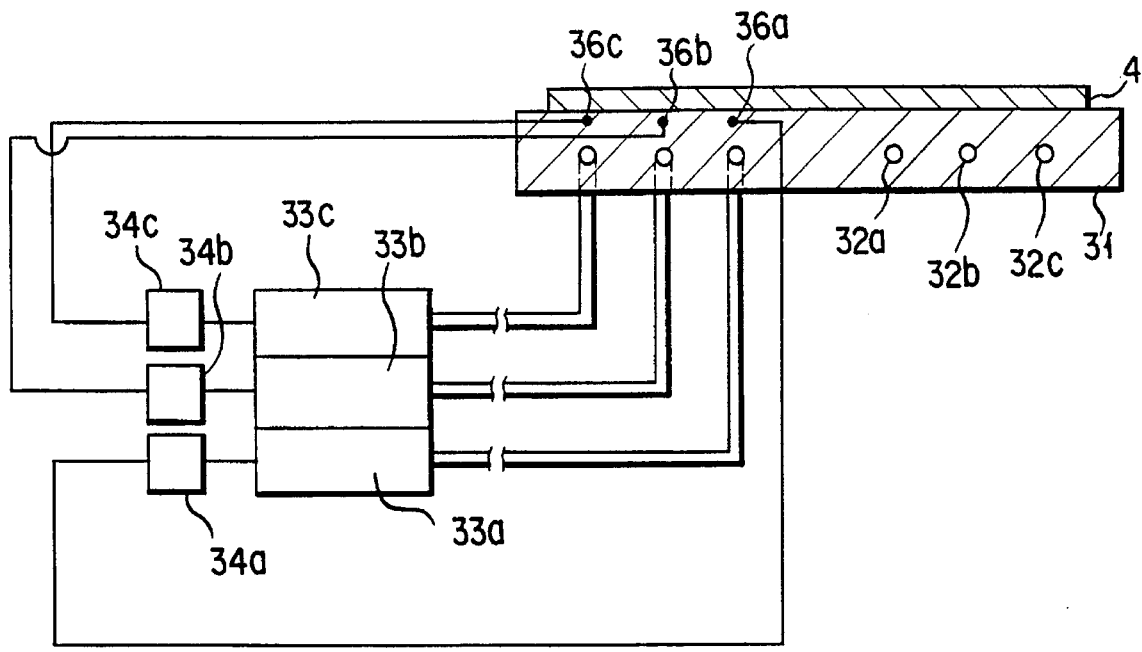
FIG. 5 is a diagram showing a longitudinal cross-section of another mechanism for creating a temperature distribution on an object to be coated.

FIG. 5 shows another example of the cooling apparatus, in which temperature sensors 36a, 36b, and 36c are provided in the plate 31, and the temperature of the coolant is controlled by the temperature controllers 34a, 34b, and 34c on the basis of the values detected by the temperature sensors.

A temperature distribution is not necessarily created by the above-described means, but can be created by thermoelectric cooling. Otherwise, the cooling plate may be made of materials having different thermal conductivities arranged concentrically to create a temperature distribution.

Figure 6:
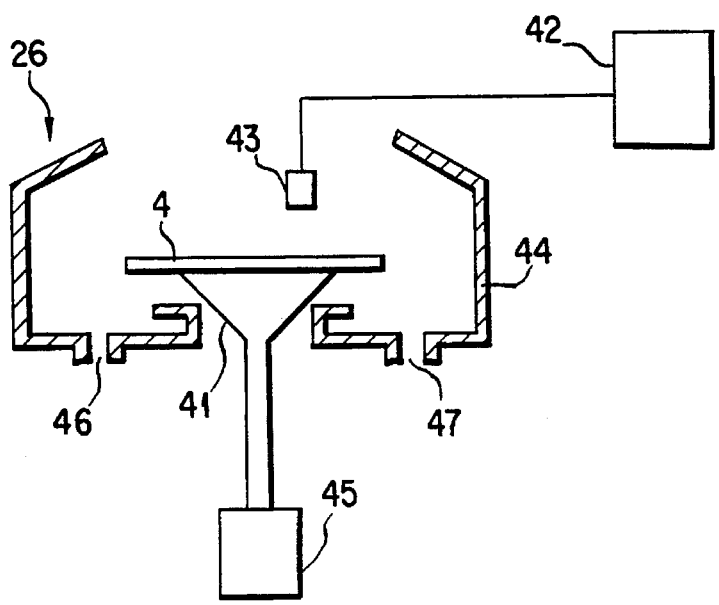
FIG. 6 is a schematic diagram showing the coating apparatus according to the embodiment of the present invention.

As shown in FIG. 6, the first coating apparatus 26 comprises a chuck 41 to hold a semiconductor wafer 4 by vacuum suction or the like, a discharge nozzle 43 to supply a resist liquid as a coating liquid on the semiconductor wafer 4, a storage vessel 42 for storing the resist which is deposited from the nozzle 43, and a cup 44 covering the chuck 41. In the first coating apparatus 26, a resist liquid is coated on the semiconductor wafer 4, which has a predetermined temperature distribution created by the cooling apparatus 25, with the result that a resist layer is formed.

The chuck 41 is connected to and rotated by a motor 45 at a high speed. Accordingly, a semiconductor wafer held by the chuck is rotated at the high speed. The rotation speed of the motor 45 is controlled by a predetermined program by a controller (not shown).

The resist liquid stored in the storage vessel 42 is supplied through a filter, a bellows pump, a suck back valve, and the like (not shown) to the nozzle 43, and supplied to the semiconductor wafer 4.

When the wafer 4 is rotated and the resist liquid is coated thereon, the cup 44 prevents the resist liquid sprinkled off from the peripheral edge of the wafer 4 from spattering. A drain port 46 and a gas exhaustion port 47 are formed in a bottom portion of the cup 44. Drainage and gas are exhausted through the ports 46 and 47, respectively, from the cup 44.

The cup 44 is movable upward and downward. When a semiconductor wafer is transferred into or from the cup 44, the cup 44 is moved downward so that the chuck 41 is exposed above the central portion of the cup 44, to enable the semiconductor wafer 4 to be transferred easily.

The second coating apparatus 27 may be of the same as the first coating apparatus 26 or a developing apparatus for performing a process after exposure. If the second coating apparatus 27 is used as a developing apparatus, an exposure apparatus may be provided on the right end of the passageway 22 of FIG. 2, in which case a resist coating step and a developing step can be serially performed in the coating apparatus.

Figure 7:
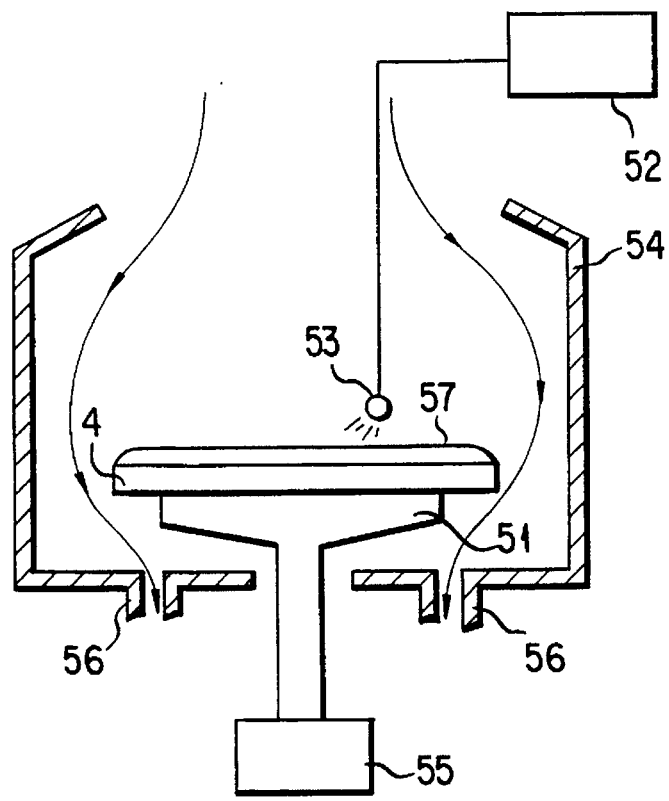
FIG. 7 is a schematic diagram showing the coating apparatus according to another embodiment of the present invention.

As shown in FIG. 7, the developing apparatus 27 comprises a chuck 51 to hold a semiconductor wafer 4 by vacuum suction or the like, a supplying section 53 having a plurality of nozzles, formed above the chuck 51, for supplying a developing liquid to the semiconductor wafer 4, a storage vessel 52 for storing the developing liquid which is supplied through the supplying section 53, and a cup 54 covering the chuck 51. The chuck 51 is connected to a motor 55, which rotates the chuck 51. The developing solution is supplied to the semiconductor wafer 4 a layer of the developing solution is formed on the wafer 4 such that the developing solution is kept on the semiconductor wafer 4 for certain time, thereby performing an developing operation.

In this case, in order to spread the developing solution over the semiconductor wafer 4 in a short time, the wafer is rotated. Therefore, the developing rate varies in the central and peripheral portions of the wafer, due to the difference in their peripheral speed.

A gas exhaustion port 56 is formed in a bottom portion of the cup 54. The gas in the cup is exhausted through the gas exhaustion port 56. The developing operation is performed while the cup 54 is being exhausted with a developing liquid 57 deposited on the semiconductor wafer 4. At this time, the temperature of the peripheral portion of the semiconductor wafer 4 is lower than that of the central portion, with the result that the peripheral portion tends to be developed at a lower rate than in the central portion. To prevent this, prior to the developing operation, the semiconductor wafer is transferred to the cooling apparatus 25 after prebaking and cooled so as to create a temperature distribution such that the temperature of the peripheral portion of the wafer is higher than the central portion. The developing speed can be constant by keeping the temperature distribution of the wafer.

An operation of the above resist processing unit will now be described. First, in the loader section 2, a semiconductor wafer 4 to be processed is taken out of the cassette 5 by the carriage mechanism 7. The wafer is transferred from the carriage mechanism 7 to the receiving/transmitting mechanism 8 by the stage pin 9, and centered by the centering guide 10.

The semiconductor wafer is then transferred from the receiving/transmitting mechanism 8 to the carriage apparatus 21 of the processing section 3. The carriage apparatus 21 first carries the wafer to the AD processing apparatus 23. The AD processing apparatus 23 heats the semiconductor wafer 4 to a temperature of about 80° to 100° C. in an HMDS atmosphere, thereby performing an AD process.

After the AD process, the semiconductor wafer 4 is transferred to the cooling apparatus 25 by the carriage apparatus 21. In the cooling apparatus 25, the semiconductor wafer 4 is placed on the cooling plate 31 having a predetermined temperature distribution which has been created by supplying a coolant to the cooling tube 32a, 32b, and 32c as described above. Thus, a temperature distribution corresponding to the temperature of the cooling plate 31 is created on the semiconductor wafer 4.

The semiconductor wafer 4 having the temperature distribution is transferred from the cooling apparatus 25 to the coating apparatus 26 by the carriage apparatus 21. In the coating apparatus 26, the semiconductor wafer 4 is held by the chuck 41 by vacuum suction while the cup 44 is lowered. Although the temperature of the wafer 4 is slightly changed by the influence of the ambient atmosphere, the temperature distribution created by the cooling apparatus 25 is substantially maintained.

When the wafer 4 is held by the chuck 41, the arm 21a of the carriage apparatus 21 is retrieved and the cup 44 is moved upward. In this state, a resist coating operation is performed as follows: First a resist liquid is dropped from the discharge nozzle 43 on the wafer 4 adhered to the chuck 41. Then, the chuck 41 is rotated at a high speed at a predetermined rotation rate. As a result, the resist liquid is spread out and coated on the semiconductor wafer 4 toward the peripheral end thereof.

In the coating operation, a resist film is generally formed thicker in the peripheral portion of the semiconductor wafer 4 than in the central portion thereof owing to differences in peripheral speed. However, since the temperature of the peripheral portion of the semiconductor wafer 4 is lower than the central portion by the above-described process in the cooling apparatus 25, the solvent in the peripheral portion is volatilized at a lower speed than in the central portion, thereby canceling the difference in thickness of the resist film due to the differences in peripheral speed.

The semiconductor wafer 4, on which the resist film of a uniform thickness is formed, is transferred to the heating apparatus 24 and pre-baked therein. As a result, the solvent in the resist film is volatilized.

If the second coating apparatus 27 is a developing apparatus, the semiconductor wafer 4 is supplied to the cooling apparatus 25 and cooled therein so as to create a temperature distribution such that the temperature of the peripheral portion is higher than that of the central portion. Then, the semiconductor wafer is exposed and transferred to the developing apparatus.

In the developing apparatus, the semiconductor wafer 4 is held by the chuck 51 with the temperature distribution created by the cooling apparatus 25 substantially maintained. While the gas in the cup 54 is being exhausted, a developing liquid is supplied to the semiconductor wafer 4 through the nozzles of the supplying section 53.

At this time, since the gas in the cup 54 is exhausted, the temperature of the peripheral portion of the semiconductor wafer tends to be lowered, with the result that the peripheral portion is developed at a lower rate. However, since the temperature distribution is created on the semiconductor wafer 4 such that the temperature of the peripheral portion is higher, the overall area of the wafer 4 can be developed at a constant rate.

Figure 9:
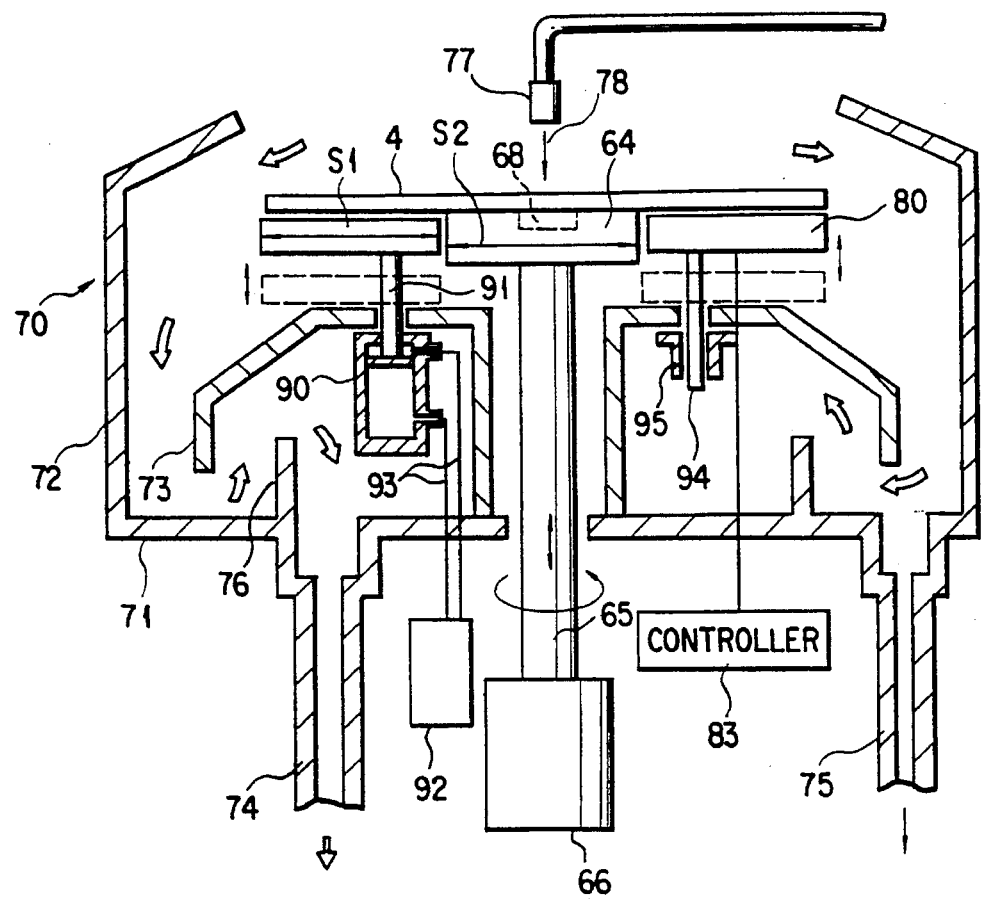
FIG. 9 is a cross sectional view showing a coating device according to another embodiment of the present invention.

Next, another embodiment of the present invention will now be described. This embodiment is directed to an example in which the temperature control of the object is carried out during the coating process. FIG. 9 is a cross sectional view showing a coating device according to this embodiment. This coating device is used as the first coating device 26 of the resist coating system shown in FIG. 2.

The coating device includes a spin chuck 64 rotatably provided for holding a semiconductor wafer 4 as an object to be coated by vacuum suction, and a spin motor 66 for rotating the spin chuck 64. The spin chuck 64 has a plate-like shape whose upper surface is flat, and a suction hole 68 in its center portion. A vacuum pump (not shown) is connected to the suction hole 68, and as the vacuum pump in driven, the semiconductor wafer 4 is held by suction to the spin chuck 64.

The spin chuck 64 should be made of a material which is less likely to create particles by friction, for example, a resin such as Delrin (tradename). The spin chuck 64 is connected to the spin motor 66 via a rotation shaft 65.

A cup 70 is provided such as to cover the spin chuck 64 for preventing scattering of the resist liquid. The cup 70 includes a bottom plate 71 through which the rotation shaft 65 is put, an annular outer portion 72 formed such that it covers the circumference of the spin chuck 64 and the upper end portion thereof is set slightly higher than the horizontal level of the spin chuck, and an annular inner portion 73 provided below the spin chuck 64.

To the bottom plate 71, there are connected a gas exhaustion pipe 74 for exhausting the cup 70, and a liquid exhaustion pipe 75 for exhausting resist liquid which flew down in the container.

A partition wall 76 for preventing the exhaustion liquid and the like from flowing into the inner side is provided in an annular fashion such as to stand on the bottom plate 71 at a position slightly inner side in a radial direction of the outer end of the inner portion 73.

Below the spin chuck 64, there are provided a number of washing liquid discharge nozzles (not shown) for discharging washing liquid such as thinner toward the rear surface of a wafer.

Above the spin chuck 64, there is provided a discharge nozzle 77 for discharging resist liquid 78 on a semiconductor wafer 4.

Figure 10:
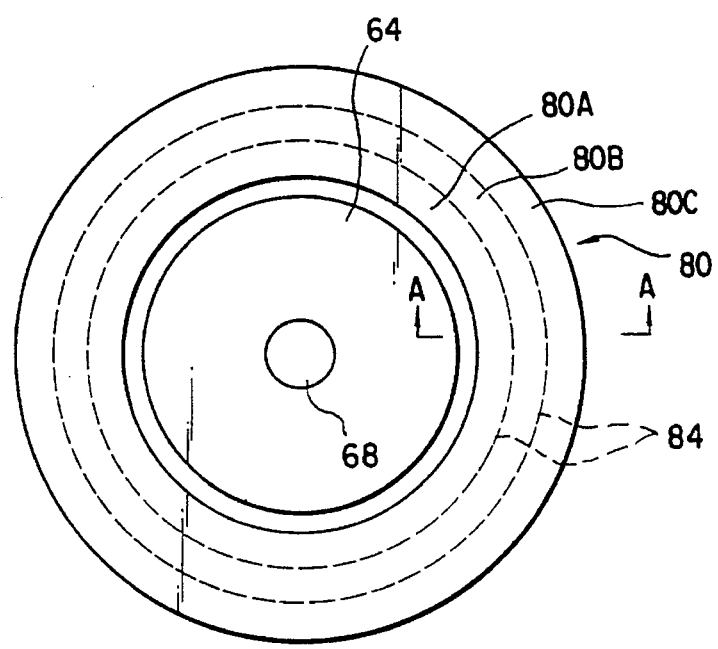
FIG. 10 is a plan view showing the main portion of the device shown in FIG. 9.
Figure 11:
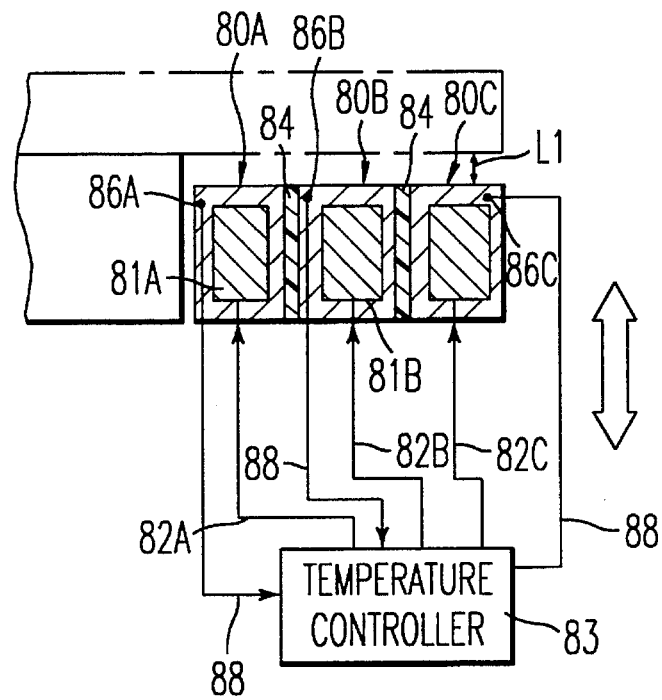
FIG. 11 is a cross sectional view showing the temperature controlling member of the device shown in FIG. 9.

Around the spin chuck 64, there is provided a ring-like temperature control member 80 ascendably/descendably in the vertical direction so that the temperature control member 80 can approach or separate from the rear surface of the circumference of the wafer 4. The main body of the temperature control member 80 is made of a material with which particles are not likely to be created, and having a high heat conductivity, for example, a resin such as Delrin, as in the case of the spin chuck 64. Further, the temperature control member 80 is coaxially divided into a number of (three in the figure) temperature control units 80A, 80B and 80C so as to carry out a fine temperature control in accordance with the radial distance from the center of a wafer as shown in FIG. 10. FIG. 11 is a cross sectional view of the structure shown in FIG. 10 taken along the line A—A. As shown in FIG. 11, the units 80A, 80B and 80C are made of a semiconductor element (for example, electronic thermal element such as Peltier element), and respectively contain built-in thermomodules 81A, 81B and 81C, which electronically store or discharge heat. The thermomodules 81A, 81B and 81C are connected to a controller 83 which is constituted by a microcomputer and the like via wirings 82A, 82B and 82C. The controller 83 serves to control the absorption or generation of heat for each module such that the modules have the same temperature or different temperatures.

The width S1 of the control member 80 is set in accordance with the size of the wafer W. For example, in the case of an 8-inch wafer, the width S1 is set at about 70 mm, preferably at a size which can cover the entire rear surface of the wafer. In this case, the diameter S2 of the spin chuck 64 is about 56 mm.

A heat insulating layer 84 formed of, for example, Teflon (tradename) is provided for each of the boarder sections between the temperature control units 80A and 80B, and 80B and 80C, so that the heat conduction between adjacent units can be suppressed, thereby achieving a temperature control at a high accuracy. Temperature sensors 86A, 86B and 86C are built in the units 80A, 80B and 80C at their comparatively upper sections so as to detect the surface temperature of each unit. The output of each sensor is input to the controller 83 via the wiring 88 for feedback control.

The temperature control member 80 can be ascended/descended by means of an air cylinder 90, serving as an ascending/descending mechanism, provided below the inner portion 73 of the cup 70. More specifically, the distal end of an expandable rod 91 of the air cylinder 90 is connected to the lower surface of the temperature control member 80. With this structure, the temperature control member 80 can be moved up or down by supplying compressed air into the cylinder 90 from a drive air source 92 via an air discharge tube 93, or exhausting the compressed air from the cylinder 90. In this case, the stroke of the cylinder should be set such that the upper surface of the temperature control member 80 approaches the lower surface of the wafer W as close as possible without touching, when the control member 80 reaches its highest level. An appropriate stroke depends upon the precision of the air cylinder 90, and for example, such a stroke should be set such that the distance L1 defined between the upper surface of the control member 80 and the lower surface of the wafer 4 is about 0.1 to 0.5 mm when the control member 80 reaches its highest level.

For other portion of the lower surface of the temperature control member 80, there is provided at least one guiding rod 94 facing downward for smoothly performing the ascending/descending operation, and the guiding rod 94 is put through a guide 95 mounted on the inner portion 73 of the cup 70. The guide 95 serves to guide the temperature control member 80.

The operation of the coating device having the above-described structure will be described.

First, a semiconductor wafer is held by an arm 21a by its periphery portion, and the arm 21a is driven to place the wafer on the spin chuck 64. The wafer is attracted onto the spin chuck 64 by vacuum suction.

In the meantime, the temperature control member 80 should be in advance/descended with respect to the spin chuck 64 so that the handling operation is not disturbed during transfer of a wafer.

Figure 12:
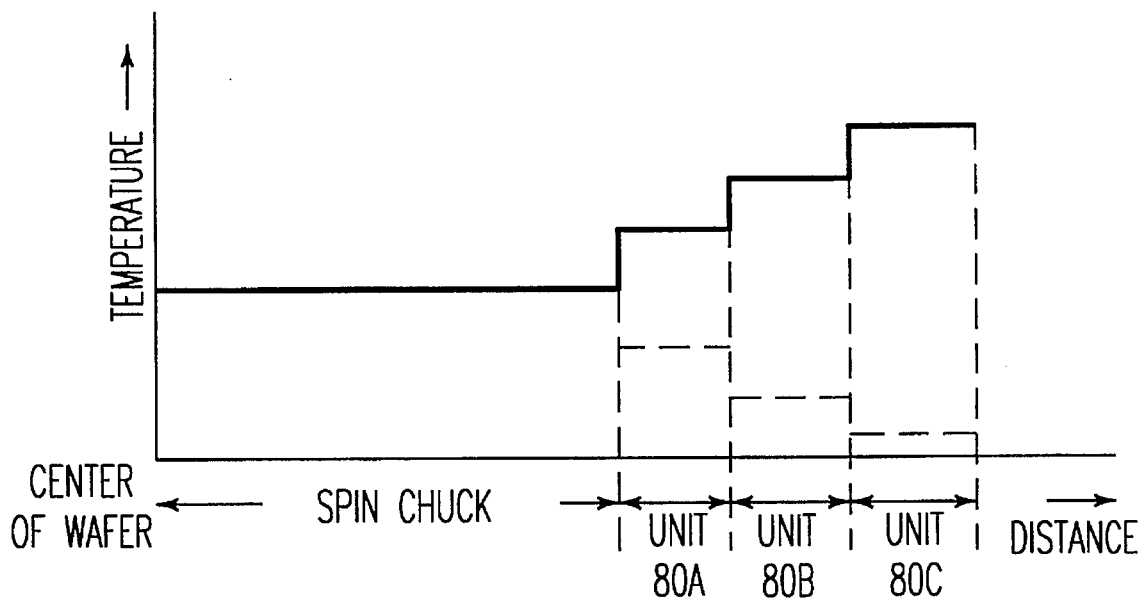
FIG. 12 is a graph showing the temperature distribution of the object.

When the settlement of the wafer 4 to the spin chuck 64 by suction is finished, compressed air is supplied from the drive air source 92 to the air cylinder 90. Therefore, the expandable rod 91 is pushed out so as to ascend the temperature control member 80 such that the upper surface thereof is brought toward the rear surface of the periphery portion of the wafer as close as possible without touching. Thus, the rear surface of the periphery portion of the wafer 4 is covered thereby from underneath. Then, the temperature of the upper surface of the temperature control member 80 is controlled by the controller 83 in accordance with the temperature characteristics of resist liquid to be applied so that the temperature distribution of the wafer 4 is appropriately maintained. At the time of application of the resist liquid, the closer to the wafer peripheral portion, the higher the circumferential speed. Thus, the solvent is easier to evaporate in the wafer peripheral portion. As a result, the temperature decreases excessively at the peripheral portion due to the heat of vaporization of the solvent. In order to compensate the decrease in temperature, the temperature of each of the temperature control units 80A–80C is set higher than that of the chuck 64 to have a stepwise temperature profile in which the temperature becomes higher toward the radial direction, for example, as shown in FIG. 12. Such temperature control is carried out by appropriately controlling electrical power supplied each of the thermomodules 81A–81C by the controller 83. In the present device, the temperature control member 80 is divided into a plurality of units, the temperature of each of which can be individually controlled, and therefore the temperature control can be performed at a high accuracy.

Thus, the temperature of the peripheral portion of the wafer 4 placed just above the ring-like temperature control member 80 without touching, can be appropriately controlled by appropriately controlling the temperature of the member 80.

With an appropriate temperature, the spin motor 64 is driven so as to rotate the wafer 4 attracted to the spin chuck at a high rotation speed, for example, 2000 rpm, and a predetermined amount of resist liquid 78 is supplied from the discharge nozzle 77 dropwise on the wafer 4. At this point, the container 56 is exhausted via the exhaustion pipe 74.

The resist liquid supplied is spread from the center of the wafer in the radial direction (toward periphery) uniformly over the surface of the wafer by the centrifugal force due to the rotation of the wafer W, and applied uniformly on the wafer surface. The excessive portion of the liquid is shaken off to scatter out of the wafer peripheral portion, and spotted on the inner wall surface of the outer portion 72 and the outer wall surface of the inner portion 73. Later, the liquid spots fall down on these walls, and are discharged out of the cup via the exhaustion tube 75.

During the application of the resist liquid, the temperature of the wafer peripheral portion is appropriately controlled by the temperature control member 80 as mentioned above, and therefore a temperature decrease in the wafer peripheral portion due to excessive evaporation of the solvent can be avoided, thereby significantly improving the uniformity of the thickness of the resist film within its surface.

When a coating step, which is set in a certain period of time, is finished, the air cylinder 90 is driven so that the ring-like temperature control member 80 is descended to separate from the rear surface of the wafer.

After that, washing liquid such as thinner is ejected from a rear-surface washing nozzle (not shown) provided below the spin chuck 64 toward the wafer 4 which is rotating, to perform the rear surface washing and side rinse (removal of resist in the wafer peripheral portion by dissolution). Thus, the resist liquid portions on the spots are removed.

When the application process of one wafer is finished, the processed wafer is transferred to the arm 20a, and a new wafer, which has not yet been processed, is placed on the spin chuck 64 as mentioned before for performing the same coating process.

In this embodiment, a temperature control member 80 is provided immediately underneath the wafer peripheral portion so that the temperature control of this portion is carried out in accordance with the temperature characteristic of the processing liquid, and therefore the uniformity of the film thickness of each object can be remarkably improved.

In the above-described device, the temperature control member 80 is divided in three zones, and the temperature of each zone can be independently controlled. However, the present invention is not limited to such a structure, but the temperature control may be performed by a temperature control member 80 as an integral body, or the control member may be divided in the greater number of zones for a further fine temperature control.

In such a device, the temperature of the temperature control member 80 is set such that it becomes higher stepwise toward the outside with reference to the temperature of the chuck as shown in FIG. 12. However, the temperature should be set in accordance with the temperature characteristic of the resist liquid to be applied, and therefore the present invention is not limited to this example. For example, in the case of a water-soluble polymer resist liquid, the temperature of the control member 80 is set such that it becomes lower stepwise toward the outside.

Figure 13:
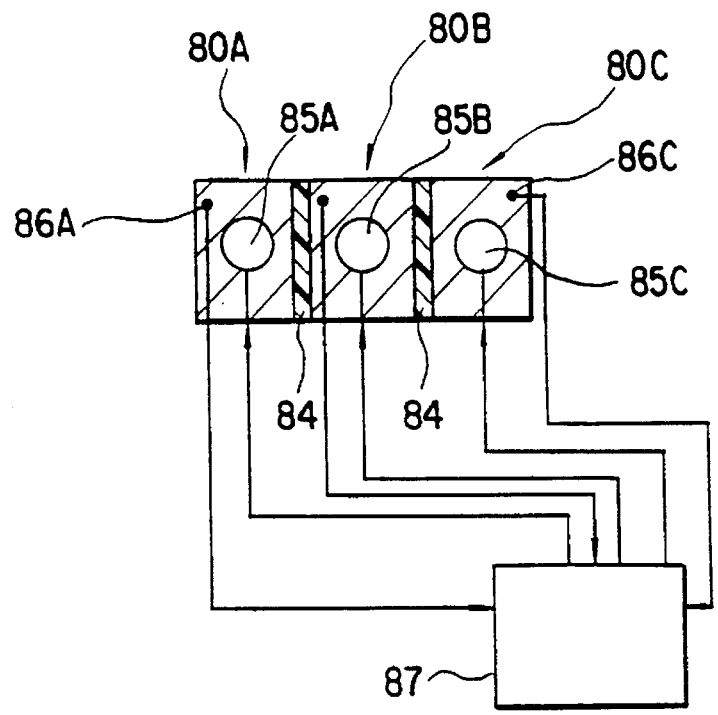
FIG. 13 is a cross sectional view of another version of the temperature controlling member used in the device shown in FIG. 9.

Further, in the above-described device, thermomodules 81A–81C each constituted by a semiconductor element serving as a heat generating/absorbing element are used as the temperature control member 80; however the present invention is not limited to such a structure. For example, as shown in FIG. 13, medium paths 85A, 85B and 85C for allowing a heat medium such as hot water or cold water may be built in respective units in place of the thermomodules. With this structure, the temperature of each of the temperature control units 80A–80C can be controlled by supplying the heat media such as hot waters having different temperatures to these units from the temperature control portion 87.

Still another embodiment of the present invention will now be described.

Figure 14:
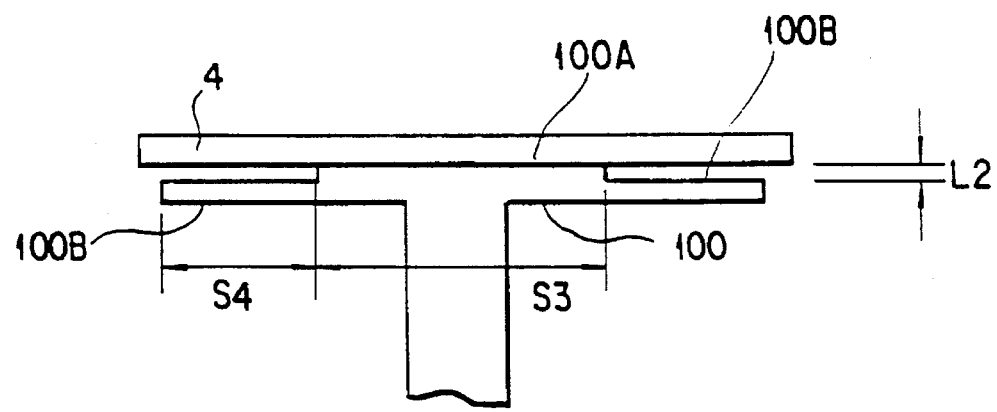
FIG. 14 is a schematic view showing the main portion of a coating device according to still another embodiment of the present invention.

FIG. 14 is a schematic diagram showing the main portion of the device according to this embodiment. In this embodiment, the shape of the spin chuck is determined so that the spin chuck itself has a temperature control function. The shape of the container, the operation of the application of liquid, and the like are similar to those of the aforementioned device, and therefore the explanation will be provided only for the spin chuck.

A spin chuck 100 of this device includes a center portion 100A for holding a wafer 4 by suction, and an outer portion 100B located outside the center portion. In the upper surface of the outer portion 100B, there is formed an annular gap G (space portion) such that the distance L2 between the wafer W and the outer portion 100B is about 0.1 to 0.5 mm.

In the case where the wafer 4 is of an 8-inch type, the diameter S3 of the spin chuck 100 is about 56 mm, and the width S4 of the outer portion 100B is about 70 mm.

The spin chuck 100 may be made entirely of a resin such as Delrin, or the portion to be brought into contact with the center portion 44B and the wafer W may be made of a resin, and the other portion may be made of a metal, for example, aluminum.

With the above structure, during the application of resist liquid by rotation, the temperature of the peripheral portion of the wafer 4 is likely to decrease more than that of the center portion. However, due to the heat influence from the spin chuck 100, the decrease in temperature of the peripheral portion of the wafer 4 is smaller than the case where the peripheral portion is not present, and the decrease in temperature is controlled by means of the gap G. Therefore, the temperature decrease in the peripheral portion of the wafer 4 is appropriately compensated. Thus, the wafer can be prevented from having different temperatures in different sections. Also, the gap G can serve to prevent particles from coming into or adhering to the rear surface of the wafer 4.

Figure 8:
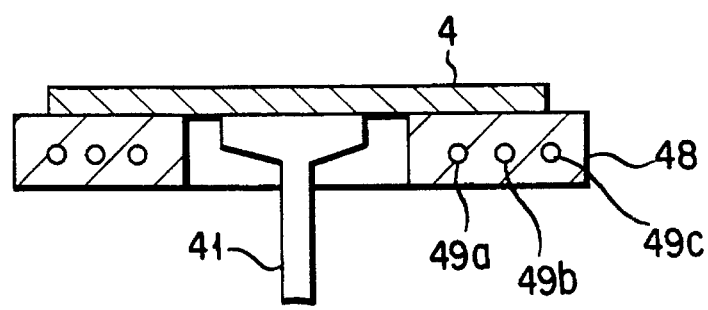
FIG. 8 is a diagram showing a longitudinal cross-section of still another mechanism for creating a temperature distribution on an object to be coated.

In the above embodiment, a temperature distribution is created on the semiconductor wafer 4 in the cooling apparatus 25 prior to the coating or developing process. However, it can be created during the coating or developing process. For example, as shown in FIG. 8, a ring-like cooling plate 48 in which cooling tubes 49a, 49b, and 49c are embedded can be provided concentrically around the chuck 41 of the coating apparatus 26 in the same manner as in the above-described cooling plate 31. The semiconductor wafer 4 held by the chuck 41 can be brought into contact with the plate 48. In this case, coolant of different temperatures are supplied to the cooling tubes 49a, 49b, and 49c, thereby creating a temperature distribution on the semiconductor wafer 4 placed on the plate 48 corresponding to differences in temperature of the coolant. Thus, a film of a uniform thickness can be formed on the wafer.

The temperature distribution on the semiconductor wafer 4 is obtained not only by the above-described cooling method in which coolant is supplied to cooling tubes but also by any other methods such as thermoelectric cooling. Further, the temperature distribution can be created by heating by means, for example, a heater.

Although the above embodiment relates to the case of coating a semiconductor wafer with a resist liquid and a developer, the present invention can be applied to a general apparatus to coating an object with a liquid, thereby forming a coating film.

Examples of such a device, apart from the resist coating device and the development solution application device, an etching liquid coating device, a magnetic liquid application device and a washing device.

Since it is an object of the invention to overcome non-uniformity of coating process between the central portion and the peripheral portion of an object to be coated, a temperature distribution is concentrically created on the object. However, it is possible to employ various temperature distributions, e.g., only the temperature in a limited portion of an object may be changed, or a step-like temperature distribution may be created, so long as the non-uniformity of the process is overcome. Further, a semiconductor wafer is used as an object to be coated in the above embodiment; however, the present invention can be applied to various processes for treating a photomask, an LCD substrate, or a rectangular substrate.

It should be noted that the above description is directed to the case of the cooling device of a coating system in which the temperature of an object is controlled, and the case of a coating device in which the temperature of an object is controlled; however, naturally the temperature control may be carried out in both cases.

Additional advantages and modifications will readily occur to those skilled in the art. Therefore, the invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. A coating method for coating resist on an object to be coated comprising the steps of:

supplying a resist to the object;

controlling a vaporizing rate of a solvent of the resist on the object by controlling a temperature distribution of a surface of the object so as to form a resist film of a uniform thickness; and rotating the object to spread the resist over the object;

wherein:

the temperature distribution is created by placing the object on a plate having a temperature distribution; and the plate comprises a plurality of annular medium supplying paths, and a temperature distribution is created on the plate by supplying medium of different temperatures to the respective medium supplying paths.

2. A coating method for coating development on an object to be coated comprising the steps of:

supplying a developer to the object;

controlling a developing rate of the object by controlling a temperature distribution of a surface of the object; and rotating the object to spread the developer over the object; wherein;

the temperature distribution is created by placing the object on a plate having a temperature distribution; and the plate comprises a plurality of annular medium supplying paths, and a temperature distribution is created on the plate by supplying mediums of different temperatures to the respective medium supplying paths.

3. A coating method according to claim 2, wherein said temperature distribution is controlled so that the temperature of a peripheral portion of the object is set higher than a central portion thereof.

4. A coating method for coating resist or developer on an object to be coated, the method comprising the steps of:

supplying a resist or a developer to the object;

creating a temperature distribution on the object; and rotating the object to spread the resist or the developer over the object;

wherein the temperature distribution on the object is created by placing the object on a plate having a temperature distribution, the plate comprising a plurality of annular medium supplying paths, and a temperature distribution is created on the plate by supplying mediums of different temperatures to the respective medium supplying paths.

* * * * *